US009166414B2

(12) United States Patent
Kim et al.

(10) Patent No.: US 9,166,414 B2
(45) Date of Patent: Oct. 20, 2015

(54) BATTERY PACK AND METHOD OF CONTROLLING THE SAME

(75) Inventors: Bong-Young Kim, Yongin-si (KR); Young-Ho Kim, Yongin-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 450 days.

(21) Appl. No.: 13/571,755

(22) Filed: Aug. 10, 2012

(65) Prior Publication Data

US 2013/0106355 A1    May 2, 2013

(30) Foreign Application Priority Data

Oct. 27, 2011    (KR) .................. 10-2011-0110692

(51) Int. Cl.
*H02J 7/00* (2006.01)
*H01M 10/44* (2006.01)
*G01R 31/36* (2006.01)

(52) U.S. Cl.
CPC ............. *H02J 7/0013* (2013.01); *H02J 7/0021* (2013.01); *H02J 7/0031* (2013.01); *G01R 31/3634* (2013.01); *H01M 10/44* (2013.01); *H01M 10/441* (2013.01); *H02J 7/0019* (2013.01); *H02J 7/0024* (2013.01); *H02J 2007/0067* (2013.01)

(58) Field of Classification Search
USPC ................................................ 320/116, 118
See application file for complete search history.

(56) References Cited

U.S. PATENT DOCUMENTS

| 6,255,803 | B1* | 7/2001 | Ishihara et al. ............... 320/134 |
| 7,554,294 | B2* | 6/2009 | Srinivasan et al. ............ 320/132 |
| 7,642,748 | B2  | 1/2010 | Glosser, Jr. et al. |
| 7,965,060 | B2* | 6/2011 | Yamabe ........................ 320/136 |
| 8,456,135 | B2* | 6/2013 | Liu ................................ 320/135 |
| 2011/0089897 | A1* | 4/2011 | Zhang et al. .................. 320/116 |
| 2011/0193526 | A1* | 8/2011 | Yang et al. .................... 320/118 |
| 2012/0052345 | A1* | 3/2012 | Kai et al. ......................... 429/61 |
| 2012/0064378 | A1* | 3/2012 | Wang et al. ....................... 429/7 |
| 2012/0212174 | A1* | 8/2012 | Ishikawa et al. .............. 320/103 |
| 2013/0049676 | A1* | 2/2013 | Ishikawa et al. .............. 320/103 |
| 2013/0106342 | A1* | 5/2013 | Iwata et al. .................... 320/101 |
| 2013/0175857 | A1* | 7/2013 | Shreevani et al. ............. 307/9.1 |
| 2013/0207594 | A1* | 8/2013 | Hung et al. .................... 320/107 |
| 2014/0009106 | A1* | 1/2014 | Andrea ........................ 320/107 |

FOREIGN PATENT DOCUMENTS

| JP | 2007-116892 A | 5/2007 |
| JP | 2007-166723 A | 6/2007 |
| JP | 2008-148486 A | 6/2008 |
| KR | 10-2000-0065657 A | 11/2000 |

* cited by examiner

*Primary Examiner* — Stacy Whitmore
(74) *Attorney, Agent, or Firm* — Lee & Morse, P.C.

(57) ABSTRACT

A battery pack including a plurality of battery cell groups including a first battery cell group and a second battery cell group, a first switch that is connected to the first battery cell group, a second switch that is connected to the second battery cell group, and a controller configured to selectively control charging and discharging operations of the first battery cell group and the second battery cell group using the first switch and the second switch.

18 Claims, 6 Drawing Sheets

BATTERY PACK AND METHOD OF CONTROLLING THE SAME

BACKGROUND

1. Field

One or more embodiments relate to a battery pack and a method of controlling the same.

2. Description of the Related Art

Generally, as portable mobile devices, such as cellular phones, laptop computers, camcorders, personal digital assistants (PDAs), and the like, have been developed, secondary chargeable/dischargeable batteries have been briskly studied. In particular, various types of secondary batteries, such as nickel-cadmium batteries, lead batteries, nickel metal hydride (NiMH) batteries, lithium ion batteries, lithium polymer batteries, metal lithium batteries, air zinc batteries, and the like, have been developed. Such a secondary battery is integrated with a circuit and constitutes a battery pack, and charging and discharging operations are performed using an external terminal of the battery pack.

A general battery pack includes a battery cell and a peripheral circuit or a protection circuit including a charge/discharge circuit. The peripheral circuit is manufactured as a printed circuit board (PCB) and is combined with the battery cell. When external power is connected via an external terminal of the battery pack, the battery cell is charged with the external power supplied via the external terminal and the charge/discharge circuit, and when a load is connected to the battery cell via the external terminal, the battery cell supplies power to the load via the charge/discharge circuit and the external terminal. In this case, the charge/discharge circuit controls the charging and discharging operations of the battery cell between the external terminal and the battery cell. Generally, the battery cell is connected to other battery cells in series or in parallel to each other according to an amount of load applied.

In addition, in order to implement various battery packs, a degree of freedom of design of battery packs is to be improved, and battery cells having various capacitances are to be used.

SUMMARY

One or more embodiments include a battery pack in which charging and discharging operations of the battery pack may be performed by combining battery cells having different capacitances so that a degree of freedom of design of the battery pack may be improved without using only a combination of cylindrical and angular shapes.

Additional aspects will be set forth in part in the description which follows and, in part, will be apparent from the description, or may be learned by practice of the presented embodiments.

According to one or more embodiments of the present invention, a battery pack includes: at least two battery cell groups; a first switch that is connected to a first battery cell group; a second switch that is connected to a second battery cell group; and a controller that selectively controls charging and discharging operations of the first battery cell group and the second battery cell group by using the first switch and the second switch.

The first battery cell group and the second battery cell group may have different capacitances.

The battery pack may further include a current adjustment unit that is connected to one of the first battery cell group and the second battery cell group.

The current adjustment unit may include a positive temperature coefficient (PTC) element.

When capacitance of the first battery cell group is greater than capacitance of the second battery cell group, the controller may control the charging and discharging operations of the first battery cell group first.

The battery pack may further include, when capacitance of the first battery cell group is greater than capacitance of the second battery cell group: a PTC element that is connected between the second battery cell group and the second switch; and a diode that is connected in parallel to the PTC element and of which an anode is connected to a positive side of the second battery cell group and of which a cathode is connected to the second switch.

The battery pack may further include: a first analog front end (AFE) circuit that detects a remaining battery amount of the first battery cell group; and a second AFE circuit that detects a remaining battery amount of the second battery cell group, wherein the controller controls the charging and discharging operations of the first battery cell group and the second battery cell group based on the remaining battery amount of the first battery cell group and the remaining battery amount of the second battery cell group obtained by the first AFE circuit and the second AFE circuit.

If capacitance of the first battery cell group is greater than capacitance of the second battery cell group, when a discharging operation is performed, the controller may discharge the first battery cell group by turning on the first switch and turning off the second switch, and when the remaining battery amount of the first battery cell group detected by the first AFE circuit is less than a first threshold value, the controller may discharge the second battery cell group by turning off the first switch and turning on the second switch.

If capacitance of the first battery cell group is greater than capacitance of the second battery cell group, when a charging operation is performed, the controller may charge the first battery cell group by turning on the first switch and turning off the second switch, and when charging of the first battery cell group is completed, the controller may charge the second battery cell group by turning off the first switch and turning on the second switch.

When the first battery cell group is charged, if discharging of the first battery cell group is needed, the controller may discharge the first battery cell group.

When the second battery cell group is charged, if discharging of the second battery cell group is needed, the controller may discharge the first battery cell group by turning off the second switch and turning on the first switch.

When the second battery cell group is charged, if discharging of the second battery cell group is needed, the controller may discharge the first battery cell group by turning off the second switch and turning on the first switch before the controller discharges the second battery cells group by turning on the second switch and turning off the first switch.

According to one or more embodiments of the present invention, a battery protection circuit includes a first switch that is connected to a first battery cell group, a second switch that is connected to a second battery cell group having capacitance less than capacitance of the first battery cell group; a current limiter that is connected between a positive side of the second battery cell group and the second switch, a diode that is connected in parallel to the current limiter, and a controller that controls charging and discharging operations of the first battery cell group first.

According to one or more embodiments of the present invention, a method of controlling a battery pack includes turning on a first switch that is connected to a first battery cell group; turning off a second switch that is connected to a second battery cell group having capacitance less than capacitance of the first battery cell group, and discharging the first battery cell group.

The method may further include: detecting a remaining battery amount of the first battery cell group; when the remaining battery amount of the first battery cell group is less than a first threshold value, turning off the first switch and turning on the second switch; and discharging the second battery cell group.

The method may further include: detecting a remaining battery amount of the second battery cell group; and when the remaining battery amount of the second battery cell group is less than a second threshold value, turning off the second switch.

According to one or more embodiments of the present invention, a method of controlling a battery pack includes: turning on a first switch that is connected to a first battery cell group; turning off a second switch that is connected to a second battery cell group having capacitance less than capacitance of the first battery cell group; and charging the first battery cell group.

The method may further include, when charging of the first battery cell group is completed: turning off the first switch and turning on the second switch; and charging the second battery cell group.

The method may further include, when charging of the first battery cell group is performed, if discharging of the first battery cell group is needed, discharging the first battery cell group.

The method may further include, when charging of the second battery cell group is performed, if discharging of the second battery cell group is needed: turning off the second switch and turning on the first switch; and discharging the first battery cell group.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Korean Patent Application No. 10-2011-0110692, filed on Oct. 27, 2011, in the Korean Intellectual Property Office, and entitled: "Battery Pack and Method of Controlling the Same," is incorporated by reference herein in its entirety.

Exemplary embodiments will now be described more fully with reference to the accompanying drawings, in which exemplary embodiments are shown. In the description, if it is determined that a detailed description of commonly-used technologies or structures related to the described embodiments may unnecessarily obscure the subject matter, the detailed description may be omitted. Also, since later-described terms are defined in consideration of the functions of the embodiments, they may vary according to users' intentions or practice. Hence, the terms must be interpreted based on the contents of the entire specification.

Figure 1:
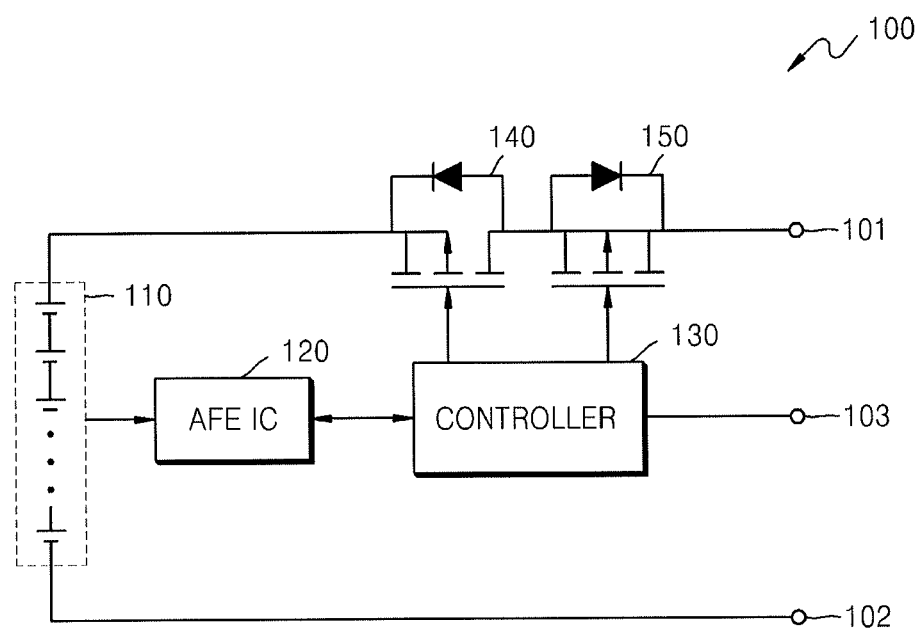
FIG. 1 illustrates a circuit diagram of an exemplary embodiment of a battery pack.

FIG. 1 illustrates a circuit diagram of an exemplary embodiment of a battery pack 100.

Referring to FIG. 1, the battery pack 100 may include a chargeable battery cell 110 and a protection circuit. The battery pack 100 may be mounted on an external system, such as a portable laptop computer, and may perform charging and discharging operations of the battery cell 110.

Referring to FIG. 1, the battery pack 100 may include the battery cell 110, an external terminal (not shown) that is connected in parallel to the battery cell 110, a discharging device 140 and a charging device 150 that are connected in series to each other on a high current path (HCP) between the battery cell 110 and the external terminal, an analog front end (AFE) integrated circuit (IC) 120 that is connected in parallel to the battery cell 110, and a controller 130 that is connected to the AFE IC 120 and controls switching of the discharging device 140 and the charging device 150.

Although not shown, the battery pack 100 may further include a fuse and a self-protection control device that are connected to the high current path (HCP). In such embodiments, the fuse may break a charge and discharge path according to a control signal of the AFE IC 120 and the self-protection control device may blow the fuse.

In such embodiments, e.g., when it is determined that the battery cell 110 is in an over-discharged or overcharged state, the controller 130 may turn off the discharging device 140 and the charging device 150 or may block overcharging or overdischarging of the battery cell 110 by blowing the fuse (not shown), as described above.

Referring to FIG. 1, the battery pack 100 may be connected to the external system via terminals 101, 102 and may perform a charging or discharging operation. The HCP, that is, a path between the terminals 101 and 102 and the battery cell 110, may be used as a charge and discharge path, and a large current may flow through the HCP. The battery pack 100 may further include a system management BUS (SMBUS) that is disposed between the controller 130 and a terminal 103 of the protection circuit so as to perform communication with the external system.

Here, the external system may be connected to the battery pack 100 via the external terminal and may include a portable electronic device, such as a portable laptop computer, with an additional adapter for supplying power. Thus, when the external system is connected to the adapter, the external system may operate due to the adapter, and the adapter may supply power to the battery cell 110 via the HCP via the external terminal and may be used to charge the battery cell 110. When the external system is detached from the adapter, a discharging operation of the battery cell 110 may be performed via the external terminal to supply power to a load of the external system.

That is, when the external system including the adapter is connected to the external terminal, a charging operation may be performed, and a charge path in this case includes the adapter, the terminal 101, the charging device 150, the discharging device 140, and the battery cell 110 in this order. When the adapter is detached from the external system and the load of the external system is connected to the external terminal, a discharging operation may be performed, and a discharge path in this case includes the battery cell 110, the discharging device 140, the charging device 150, the terminal 101, and the load of the external system.

The battery cell 110 may be a chargeable/dischargeable secondary battery cell. The battery cell 110 may output various information regarding the battery cell 110, e.g., temperature of the battery cell 110, a charge voltage of the battery cell 110, and an amount of current that flows through the battery cell 110, to the AFE IC 120.

The discharging device 140 and the charging device 150 may be connected in series to each other on the HCP between the terminal 101 and the battery cell 110 and may perform charging and discharging operations of the battery pack 100. Each of the discharging device 140 and the charging device 150 may include a field effect transistor (FET).

The AFE IC 120 may be connected in parallel to the battery cell 110 and may be connected in series between the battery cell 110 and the controller 130. The AFE IC 120 may detect a voltage value of the battery cell 110 and may transmit the detected voltage value to the controller 130.

The controller 130 may be an IC that is connected in series between the AFE IC 120 and the external system and may be a microcomputer, for example. The controller 130 may control the discharging device 140 and the charging device 150, thereby blocking overcharging, over-discharging, and over-current of the battery cell 110. That is, the controller 130 may control the discharging device 140 and the charging device 150 by outputting a switching control signal corresponding to a result of a comparison that is obtained by comparing the voltage value of the battery cell 110 that is received from the battery cell 110 via the AFE IC 120 with a voltage level value that is set in the battery cell 110. The controller 130 and/or AFE IC 120 may control the discharging device 140 and the charging device 150.

For example, when the voltage value of the battery cell 110 that is received by the controller 130 is equal to or greater than an overcharge level voltage value that is set in the battery cell 110, for example, 4.35V, the controller 130 may determine that the battery cell 110 is in an overcharged state and may output a switching control signal corresponding to the overcharged state, thereby turning off the FET of the charging device 150. Thus, charging of the battery cell 110 via the adapter of the external system is blocked. Contrary to this, when the voltage value of the battery cell 110 that is received by the controller 130 is equal to or less than an over-discharge level voltage value that is set in the battery cell 110, for example, 2.30V, the controller 130 may determine that the battery cell 110 is in an over-discharge state and may output a switching control signal corresponding to the over-discharge state, thereby turning off the FET of the discharging device 140. Thus, discharging of the battery cell 110 via the load of the external system is blocked. Although the discharging device 140 or the charging device 150 may be controlled according to a switching control signal of the controller 130, embodiments are not limited thereto, and the AFE IC 120 may control switching of the discharging device 140 and/or the charging device 150 according to a controlling operation performed by the controller 130.

Figure 2:
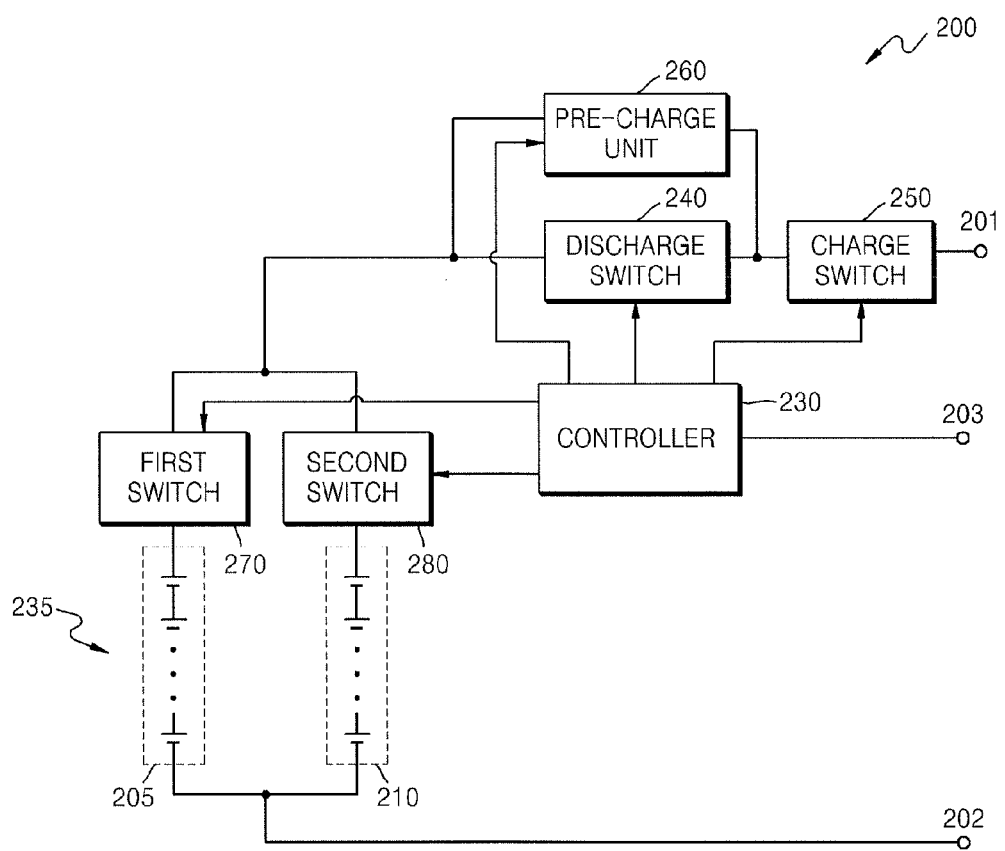
FIG. 2 illustrates a circuit diagram of another exemplary embodiment of a battery pack.

FIG. 2 illustrates a circuit diagram of another exemplary embodiment of a battery pack 200.

Referring to FIG. 2, the battery pack 200 may include a battery cell 235 including a first battery cell group 205 and a second battery cell group 210, a first switch 270 that is connected to the first battery cell group 205, a second switch 280 that is connected to the second battery cell group 210, a discharge switch 240 and a charge switch 250 that are connected in series to each other on an HCP, a pre-charge unit 260 that is connected in parallel to the discharge switch 240, and a controller 230 that controls operations of the first switch 270, the second switch 280, the discharge switch 240, the charge switch 250, and the pre-charge unit 260.

Although FIG. 2 illustrates the battery cell 235 including the first battery cell group 205 and the second battery cell group 210, the battery cell 235 is not limited thereto and may include three or more battery cell groups.

One or more of the battery cell groups, e.g., 205, 210, of the battery cell 235 may have different capacitances. For example, the first battery cell group 205 and the second battery cell group 210 may have different capacitances. Each of the first battery cell group 205 and the second battery cell group 210 may be a serial or parallel cell array.

Referring to FIG. 2, when charging and discharging operations of the first battery cell group 205 and the second battery cell group 210 are performed, the controller 230 may control operations of the first switch 270 and the second switch 280, thereby selectively controlling the charging and discharging operations of the first battery cell group 205 and the second battery cell group 210. For example, when the capacitance of the first battery cell group 205 is greater than that of the second battery cell group 210, the first battery cell group 205 may be first charged or discharged before the second battery cell group 210 is charged or discharged.

More particularly, when the charging operation is performed, the controller 230 may turn on the first switch 270 and turn off the second switch 280, thereby charging the first battery cell group 205 first, and when charging of the first battery cell group 205 is completed, the controller 230 may turn off the first switch 270 and turn on the second switch 280, thereby charging the second battery cell group 210.

When the discharging operation is performed, the controller 230 may turn on the first switch 270 and turn off the second switch 280, thereby discharging the first battery cell group 205 first, and when a remaining battery amount of the first battery cell group 205 is less than a predetermined value, the controller 230 may turn off the first switch 270 and turn on the second switch 280, thereby discharging the second battery cell group 210.

In one or more embodiments, charging and discharging operations may be separately controlled while battery cell groups having different capacitances are used. In one or more embodiments, imbalance problems that may occur during charging and discharging operations may be avoided.

The discharge switch 240 and/or the charge switch 250 may be turned off by switching control of the controller 230 when the first and second battery cell groups 205 and 210 are overcharged or over-discharged so that the HCP is broken.

The pre-charge unit 260, connected in parallel to the discharge switch 240, may be provided to prevent an inrush current from occurring in the first and second battery cell groups 205, 210 when the first and second battery cell groups 205, 210 are over-discharged. The discharge switch 240 may be turned off and then turned on again. The pre-charge unit 260 may include a pre-charge switch (not shown) and a pre-charge resistor (not shown). In one or more embodiments, the controller 230 may control the charging and discharging operations of the first battery cell group 205 and the second battery cell group 210. More particularly, the controller 230 may not by turn on the discharge switch 240 immediately after blocking overcharging of the first and second battery cell groups 205, 210. In one or more embodiments, e.g., the controller 230 may turn on the pre-charge switch of the pre-charge unit 260, allowing a current to flow through the pre-charge resistor for a predetermined amount of time, and then turn off the pre-charge switch and turn on the discharge switch 240 after a predetermined amount of time has elapsed so that the first and second battery cell groups 205 and 210 return to their normal states.

Figure 3:
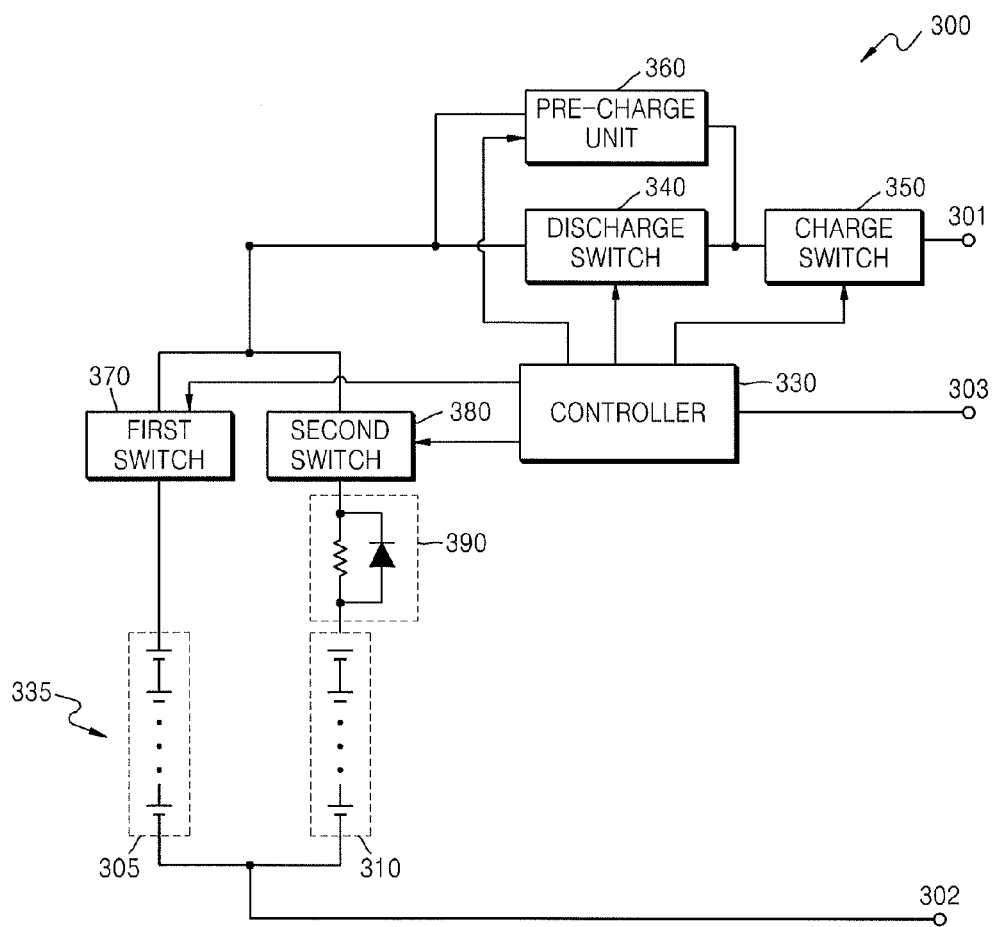
FIG. 3 illustrates a circuit diagram of another exemplary embodiment of a battery pack.

FIG. 3 illustrates a circuit diagram of another exemplary embodiment of a battery pack 300. In general, only differences between the exemplary battery pack 300 of FIG. 3 and the battery pack 200 of FIG. 2 will be described below, i.e., description of elements already described will not be repeated as like reference numbers refer to like elements.

The battery back 300 may include a battery cell 335 including a first battery cell group 305 and a second battery cell group 310, a first switch 370 that is connected to the first battery cell group 305, a second switch 380 that is connected to the second battery cell group 310, a discharge switch 340 and a charge switch 350 that are connected in series to each other on an HCP, a pre-charge unit 360 that is connected in parallel to the discharge switch 340, and a controller 330 that controls operations of the first switch 370, the second switch 380, the discharge switch 340, the charge switch 350, and the pre-charge unit 360. Referring to FIG. 3, the battery pack 300 may further include a current adjustment unit 390 that is disposed between the second switch 380 and the second battery cell group 310. Capacitances of the first and second battery cell groups 305, 310 may be different. More particularly, e.g., a capacitance of the first battery cell group 305 may be larger than a capacitance of the second battery cell group 310.

The current adjustment unit 390 may perform a function of adjusting a charge current, because capacitances of the first and second battery cell groups 305, 310 may be different from each other and their charge capacitance characteristics are varied. The current adjustment unit 390 may be a positive temperature coefficient (PTC) element. The PTC element is a semiconductor device that is capable of limiting a flow of current, e.g., resistance of the PTC element rapidly increases when an ambient temperature rises. As illustrated in FIG. 3, current adjustment unit 390, e.g., the PTC element, may be connected between the second switch 380 and the second battery cell group 310 so as to charge the second battery cell group 310 having a capacitance less than that of the first battery cell group 305 with a small charge current. However, since a discharge current needs to be flown out according to characteristics of the external system when a discharging operation of the first and second battery cell groups 305, 310 is performed, the flow of current is not limited during the discharging operation by connecting the PTC element and a diode in parallel to each other. A positive side of the second battery cell group 310 and an anode of the diode may be connected to each other, and the second switch 380 and a cathode of the diode may be connected to each other so as not to limit a flow of discharge current. The controller 330 may control the first and second battery cell groups 305, 310 such that a discharge current may flow through the external system according to operation levels of the external system without passing through the PTC element during the discharging operation.

Figure 4:
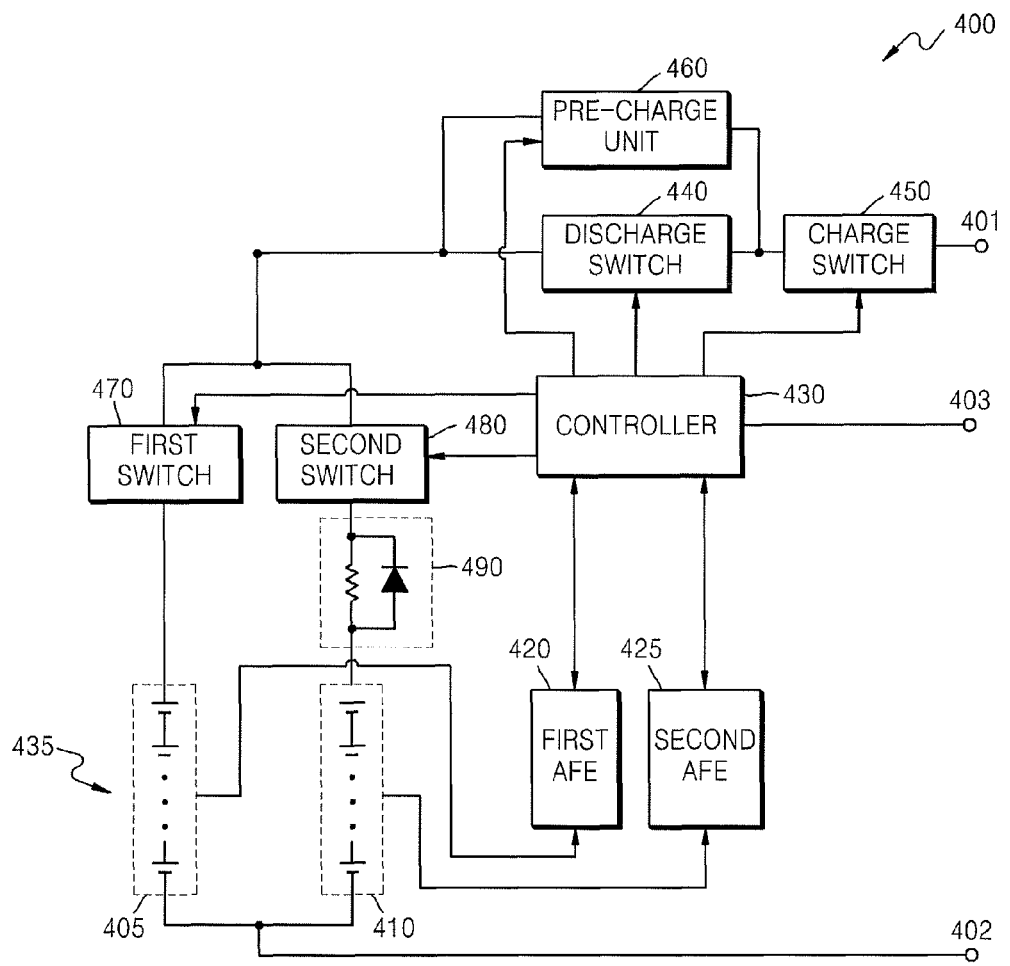
FIG. 4 illustrates a circuit diagram of another exemplary embodiment of a battery pack.

FIG. 4 illustrates a circuit diagram of another exemplary embodiment of a battery pack 400. In general, only differences between the exemplary battery pack 300 of FIG. 3 and the battery pack 200 of FIG. 2 will be described below, i.e., description of elements already described will not be repeated as like reference numbers refer to like elements.

The battery back 400 may include a battery cell 435 including a first battery cell group 405 and a second battery cell group 410, a first switch 470 that is connected to the first battery cell group 405, a second switch 480 that is connected to the second battery cell group 410, a discharge switch 440 and a charge switch 450 that are connected in series to each other on an HCP, a pre-charge unit 460 that is connected in parallel to the discharge switch 440, a controller 430 that controls operations of the first switch 470, the second switch 480, the discharge switch 440, the charge switch 450, and the pre-charge unit 460, and a current adjustment unit 490 that is disposed between the second switch 480 and the second battery cell group 410. Capacitances of the first and second battery cell groups 405, 410 may be different. More particularly, e.g., a capacitance of the first battery cell group 405 may be larger than a capacitance of the second battery cell group 410.

Referring to FIG. 4, the battery pack 400 may further include a plurality of AFE circuits, e.g., a first AFE circuit 420 that is connected to a first battery cell group 405 and a second AFE circuit 425 that is connected to a second battery cell group 410.

The first AFE circuit 420 may detect battery information regarding the first battery cell group 405, for example, a battery voltage, a remaining battery amount, and the like. The first AFE circuit 420 may transmit the detected battery information to the controller 430.

The second AFE circuit 425 may detect battery information regarding the second battery cell group 410, for example, a battery voltage, a remaining battery amount, and the like. The second AFE circuit 425 transmits the detected battery information to the controller 430.

The controller 430 may selectively control charging and discharging operations of the first battery cell group 405 and the second battery cell group 410 based on the battery information, in particular, information regarding the remaining battery amount of each of the first and second battery cell groups 405, 410. For example, when a capacitance of the first battery cell group 405 is greater than a capacitance of the second battery cell group 410, the first battery cell group 405 may be first charged or discharged. When the first battery cell group 405 is discharged, the controller 430 may receive the information regarding the remaining battery amount of the first battery cell group 405 from the first AFE circuit 420 and may determine whether the remaining battery amount is less than a first threshold value. Here, the first threshold value may be arbitrarily determined, for example, in a range between 0% and 5%, for example. When it is determined that the remaining battery amount is less than the first threshold value, the first switch 470 may be turned off, and the second switch 480 may be turned on so that the second battery cell group 410 may be discharged. The controller 430 may receive the information regarding the remaining battery amount of the second battery cell group 405 from the second AFE circuit 425 and may determine whether the remaining battery amount is less than a second threshold value. Here, the second threshold value may be arbitrarily determined, for example, 0%. When it is determined that the remaining battery amount is less than the second threshold value, the second switch 480 may be turned off so that the battery pack 400 may be in an operation stop or sleep mode. When the battery cell 435 is charged, the controller 430 may charge the first battery cell group 405 first, and when charging of the first battery cell group 405 is completed, the controller 430 may charge the second battery cell group 410.

Figure 5:
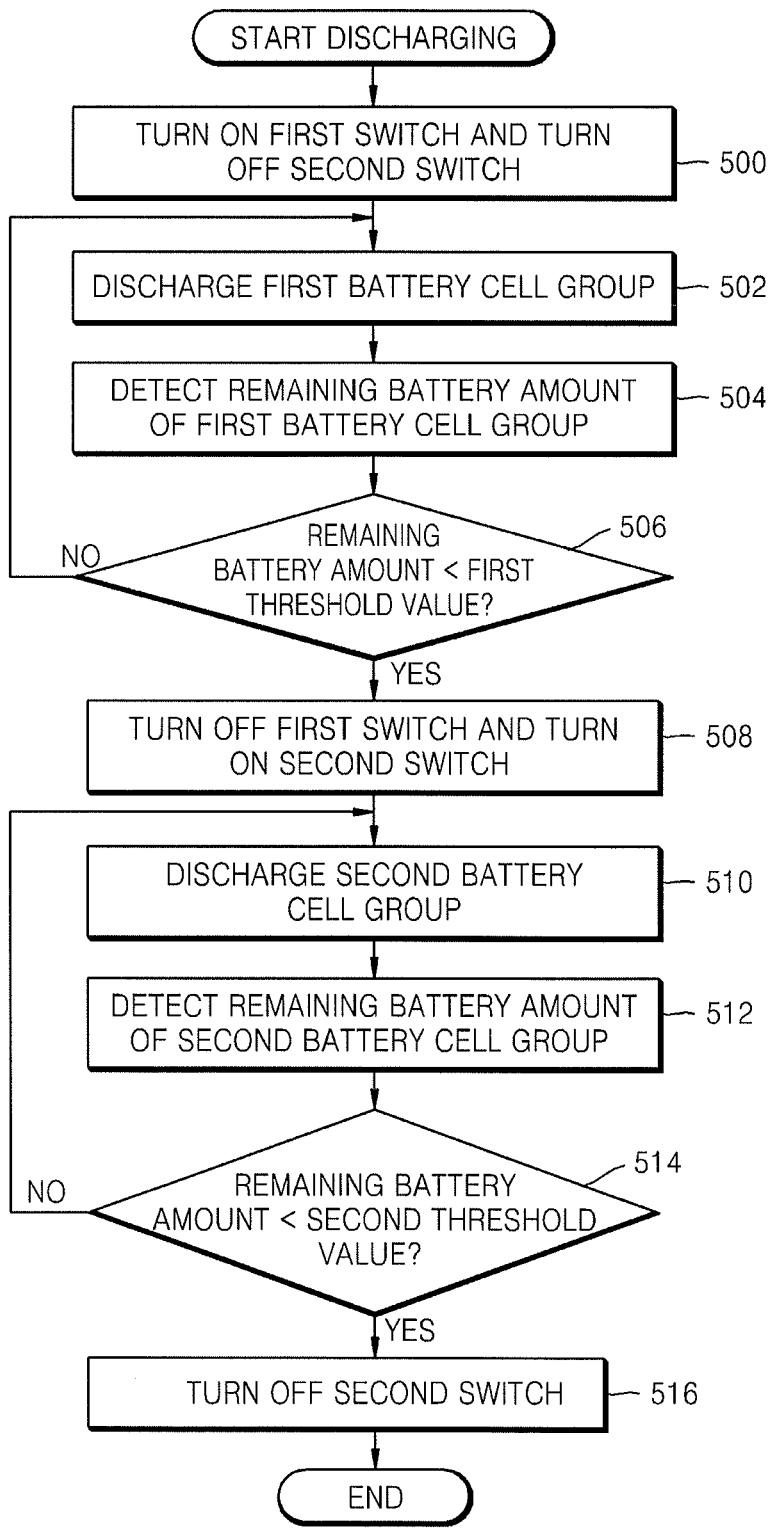
FIG. 5 illustrates a flowchart of an exemplary embodiment of a method of controlling a battery pack.

FIG. 5 illustrates a flowchart of an exemplary embodiment of a method of controlling a battery pack.

A discharging operation will now be described with reference to FIG. 5.

In operation 500, a first switch that is connected to a first battery cell group is turned on, and a second switch that is connected to a second battery cell group having capacitance less than that of the first battery cell group is turned off.

In operation 502, the first battery cell group is discharged.

In operation 504, a remaining battery amount of the first battery cell group is detected.

In operation 506, it is determined whether the remaining battery amount of the first battery cell group is less than a first threshold value. As a result of determination in operation 506, when it is determined that the remaining battery amount of the first battery cell group is less than the first threshold value, processing may proceed to operation 508, and the first switch is turned off, and the second switch is turned on. As a result of determination in operation 506, when it is determined that the remaining battery amount of the first battery cell group is equal to or greater than the first threshold value, processing may go back to operation 502.

In operation 510, the second battery cell group is discharged.

In operation 512, a remaining battery amount of the second battery cell group is detected.

In operation 514, it is determined whether the remaining battery amount of the second battery cell group is less than a second threshold value. As a result of determination in operation 514, when it is determined that the remaining battery amount of the second battery cell group is less than the second threshold value, processing may proceed to operation 516, and the second switch is turned off. As a result of determination in operation 514, when it is determined that the remaining battery amount of the second battery cell group is equal to or greater than the second threshold value, processing may proceed to operation 510.

Figure 6:
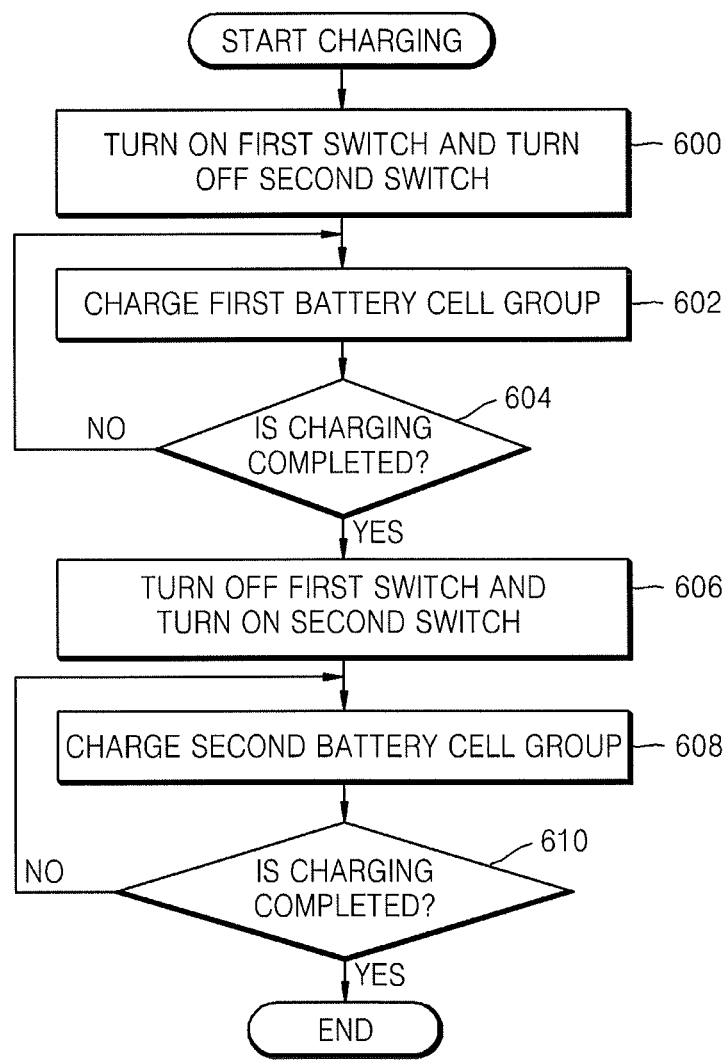
FIG. 6 illustrates a flowchart of another exemplary embodiment of a method of controlling a battery pack.

FIG. 6 illustrates a flowchart of another exemplary embodiment of a method of controlling a battery pack.

A charging operation will now be described with reference to FIG. 6.

In operation 600, a first switch that is connected to a first battery cell group is turned on, and a second switch that is connected to a second battery cell group having capacitance less than that of the first battery cell group is turned off.

In operation 602, the first battery cell group is charged. Although not shown, when operation 602 is performed, if discharge is needed, the first battery cell group is discharged.

In operation 604, it is determined whether charging of the first battery cell group is completed. As a result of determination in operation 604, when it is determined that charging of the first battery cell group is completed, processing may proceed to operation 606, and the first switch is turned off, and the second switch is turned on.

In operation 608, the second battery cell group is charged. Although not shown, when operation 608 is performed, if discharge is needed, the second switch is turned off, and the first switch is turned on so that the first battery cell group may be discharged first. In operation 610, when charging of the second battery cell group is completed, processing may be terminated, and when charging of the second battery cell group is not completed, processing may go back to operation 608.

As described above, in one or more embodiments of a battery pack employing one or more features described herein, charging and discharging operations of the battery pack may be performed by combining battery cells having different capacitances so that a degree of freedom of design of the battery pack may be improved without using only a combination of cylindrical and angular shapes.

One or more embodiments may include a processor, a memory for storing program data and executing it, a permanent storage such as a disk drive, a communications port for handling communications with external devices, and user interface devices, including a display, keys, etc. When software modules are involved, these software modules may be stored as program instructions or computer readable codes executable on the processor on non-transitory computer-readable media such as read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion. This media can be read by the computer, stored in the memory, and executed by the processor.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to exemplary embodiments illustrated in the drawings, and specific language has been used to describe these embodiments. However, no limitation of the scope of embodiments intended by this specific language, and embodiments should be construed to encompass all embodiments that would normally occur to one of ordinary skill in the art.

Embodiments may be described in terms of functional block components and various processing steps. Such functional blocks may be realized by any number of hardware and/or software components configured to perform the specified functions. For example, embodiments may employ various integrated circuit components, e.g., memory elements, processing elements, logic elements, look-up tables, and the like, which may carry out a variety of functions under the control of one or more microprocessors or other control devices. Similarly, where the elements of embodiments are implemented using software programming or software elements the invention may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, embodiments could employ any number of conventional techniques for electronics configuration, signal processing and/or control, data processing and the like. The words "mechanism" and "element" are used broadly and are not limited to mechanical or physical embodiments, but can include software routines in conjunction with processors, etc.

The particular implementations shown and described herein are illustrative examples of the invention and are not intended to otherwise limit the scope of embodiments in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of embodiments unless the element is specifically described as "essential" or "critical".

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as") provided herein, is intended merely to better illuminate features of embodiments and does not pose a limitation on the scope of embodiments unless otherwise claimed. Numerous modifications and adaptations will be readily apparent to those skilled in this art without departing from the spirit and scope of embodiments.

What is claimed is:

1. A battery pack, comprising:
   a plurality of battery cell groups including a first battery cell group and a second battery cell group;
   a first switch connected to the first battery cell group;
   a second switch connected to the second battery cell group; and
   a controller to selectively control charging and discharging operations of the first battery cell group and the second battery cell group using the first switch and the second switch, wherein
   when a capacitance of the first battery cell group is greater than a capacitance of the second battery cell group, the controller controls the charging and discharging operations of the first battery cell group first.

2. The battery pack as claimed in claim 1, wherein the first battery cell group and the second battery cell group have different capacitances.

3. The battery pack as claimed in claim 1, further comprising a current adjustment unit connected to one of the first battery cell group and the second battery cell group.

4. The battery pack as claimed in claim 3, wherein the current adjustment unit includes a positive temperature coefficient (PTC) element.

5. A method of controlling the battery pack as claimed in claim 1, the method comprising:
   turning on a first switch connected to a first battery cell group;
   turning off a second switch connected to a second battery cell group having a capacitance less than a capacitance of the first battery cell group; and
   discharging the first battery cell group.

6. The method as claimed in claim 5, further comprising:
   detecting a remaining battery amount of the first battery cell group;
   when the remaining battery amount of the first battery cell group is less than a first threshold value, turning off the first switch and turning on the second switch; and
   discharging the second battery cell group.

7. The method as claimed in claim 6, further comprising:
   detecting a remaining battery amount of the second battery cell group; and
   when the remaining battery amount of the second battery cell group is less than a second threshold value, turning off the second switch.

8. A method of controlling the battery pack as claimed in claim 1, the method comprising:
   turning on a first switch connected to a first battery cell group;
   turning off a second switch connected to a second battery cell group having capacitance less than capacitance of the first battery cell group; and
   charging the first battery cell group.

9. The method as claimed in claim 8, further comprising, when charging of the first battery cell group is completed:
   turning off the first switch and turning on the second switch; and
   charging the second battery cell group.

10. The method as claimed in claim 8, further comprising, when charging of the first battery cell group is performed, and discharging of the first battery cell group is needed, discharging the first battery cell group.

11. The method as claimed in claim 8, further comprising, when charging of the second battery cell group is performed, and discharging of the second battery cell group is needed:
    turning off the second switch and turning on the first switch; and
    discharging the first battery cell group.

12. A battery pack, comprising:
    a plurality of battery cell groups including a first battery cell group and a second battery cell group, the second battery cell group having a greater capacitance than that of the first battery cell group;
    a first switch connected to the first battery cell group;
    a second switch connected to the second battery cell group; and
    a controller to selectively control charging and discharging operations of the first battery cell group and the second battery cell group using the first switch and the second switch;
    a PTC element connected between the second battery cell group and the second switch; and
    a diode connected in parallel to the PTC element and of which an anode is connected to a positive side of the second battery cell group and of which a cathode is connected to the second switch.

13. A battery pack, comprising:
    a plurality of battery cell groups including a first battery cell group and a second battery cell group;
    a first switch connected to the first battery cell group;
    a second switch connected to the second battery cell group; and
    a controller to selectively control charging and discharging operations of the first battery cell group and the second battery cell group using the first switch and the second switch;
    a first analog front end (AFE) circuit to detect a remaining battery amount of the first battery cell group; and
    a second AFE circuit to detect a remaining battery amount of the second battery cell group,
    wherein the controller controls the charging and discharging operations of the first battery cell group and the second battery cell group based on the remaining battery amount of the first battery cell group and the remaining battery amount of the second battery cell group obtained by the first AFE circuit and the second AFE circuit, respectively.

14. The battery pack as claimed in claim 13, wherein a capacitance of the first battery cell group is greater than a capacitance of the second battery cell group, wherein:
    when a discharging operation is performed, the controller discharges the first battery cell group by turning on the first switch and turning off the second switch, and when the remaining battery amount of the first battery cell group detected by the first AFE circuit is less than a first threshold value, the controller discharges the second battery cell group by turning off the first switch and turning on the second switch.

15. The battery pack as claimed in claim 13, wherein a capacitance of the first battery cell group is greater than a capacitance of the second battery cell group, wherein:

when a charging operation is performed, the controller charges the first battery cell group by turning on the first switch and turning off the second switch, and when charging of the first battery cell group is completed, the controller charges the second battery cell group by turning off the first switch and turning on the second switch.

16. The battery pack as claimed in claim 15, wherein, when the first battery cell group is charged, and discharging of the first battery cell group is needed, the controller discharges the first battery cell group.

17. The battery pack as claimed in claim 15, wherein, when the second battery cell group is charged, and discharging is needed, the controller discharges the first battery cell group by turning off the second switch and turning on the first switch.

18. The battery pack as claimed in claim 17, wherein, when the second battery cell group is charged, and discharging is needed, the controller discharges the first battery cell group by turning off the second switch and turning on the first switch before the controller discharges the second battery cells group by turning on the second switch and turning off the first switch.

\* \* \* \* \*